United States Patent

Ohashi et al.

[11] Patent Number: 5,825,187
[45] Date of Patent: Oct. 20, 1998

[54] MAGNETIC CIRCUIT SYSTEM WITH OPPOSITE PERMANENT MAGNETS

[75] Inventors: Ken Ohashi; Yuhito Yoneda; Koji Miyata; Dai Higuchi, all of Fukui-ken, Japan

[73] Assignee: Shin-Etsu Chemical Co., Ltd., Tokyo, Japan

[21] Appl. No.: 843,053

[22] Filed: Apr. 11, 1997

[30] Foreign Application Priority Data

Apr. 12, 1996 [JP] Japan ................................. 8-091049

[51] Int. Cl.$^6$ .................................................. G01V 3/00
[52] U.S. Cl. ........................................... 324/319; 324/320
[58] Field of Search .................................. 324/318, 319, 324/320, 321, 322; 128/653.5

[56] References Cited

U.S. PATENT DOCUMENTS

| | | | |
|---|---|---|---|
| 4,631,481 | 12/1986 | Young et al. | 324/320 |
| 5,061,897 | 10/1991 | Danby et al. | 324/318 |
| 5,363,078 | 11/1994 | Ries et al. | 335/297 |
| 5,414,399 | 5/1995 | Breneman et al | 324/318 |
| 5,495,171 | 2/1996 | Danby et al. | 324/318 |
| 5,555,251 | 9/1996 | Kinanen | 324/318 |
| 5,631,616 | 5/1997 | Ohta et al. | 324/318 |

FOREIGN PATENT DOCUMENTS 2-80033  3/1990  Japan.

Primary Examiner—Louis M. Arana
Attorney, Agent, or Firm—Wenderoth, Lind & Ponack, L.L.P.

[57] ABSTRACT

The present invention provides is an improvement in a magnetic circuit system with a pair of opposite permanent magnets to construct an MRI instrument comprising a pair of upper and lower permanent magnets connected with yokes to form an air gap space therebetween, in which the patient under MRI inspection is kept lying, a pair of shimmed pole pieces each mounted on the permanent magnet to face the air gap and a pair of gradient coils each mounted on the shimmed pole piece to face the air gap. The improvement comprises mounting a cancellation magnetic plate, which is a thin plate of a magnetic material having a coercive force of 0.1 to 500 Oe, on the gradient coil to face the air gap with an object to cancel the residual magnetization of the shimmed pole piece by the gradient magnetic field. The cancellation magnetic plate has a thickness not exceeding 0.5 mm and has a base area which is 5 to 75% relative to the base area of the gradient coil.

5 Claims, 3 Drawing Sheets

MAGNETIC CIRCUIT SYSTEM WITH OPPOSITE PERMANENT MAGNETS

BACKGROUND OF THE INVENTION

The present invention relates to a magnetic circuit system with opposite permanent magnets or, more particularly, to an improvement in a magnetic circuit system with opposite permanent magnets suitable for creating a space of uniform biased magnetic field, for example, in an MRI (magnetic resonance imaging) instrument used in medical diagnosis.

It is a current trend in medical MRI instruments, in which the patient or subject person under inspection is kept lying in a uniform biased magnetic field, that the uniform magnetic field is generated by using, in place of electromagnets, permanent magnets which are much more economical and more convenient in handling than electromagnets or, in particular, superconductive electromagnets because the MRI instrument can be operated without a highly stabilized electric power source for the electromagnets or without supply of liquid helium which is indispensable for running a superconductive electromagnet.

The magnetic circuit systems in the MRI instruments currently under running in hospitals by using permanent magnets include those of the dipolar ring magnet type and opposite-magnets type. The dipolar ring magnet system is, being constructed basically of a plurality of permanent magnets alone as is disclosed by K. Halbach in Nuclear Instruments and Methods, volume 189, page 1 (1980), advantageous because the structure of magnets can be simple with a relatively small overall weight of the magnet system as compared with the opposite-magnets systems. MRI instruments using a dipolar ring magnet system are described, for example, in U.S. Pat. No. 4,580,098, Japanese Patent Kokai 62-104011 and elsewhere.

The above mentioned economical advantage of the dipolar ring magnet system in respect of the small overall weight of the magnet system as compared with the opposite-magnet systems, however, is limited only to the MRI instruments in which the magnetic flux density is relatively large to exceed about 0.2 T (tesla) because the overall weight of the dipolar ring magnet system cannot be decreased so low even for an instrument in which the magnetic flux density required is so small as not to exceed 0.2 T. In addition, the patient lying under medical inspection using an MRI instrument of the dipolar ring magnet system necessarily receives a feeling of oppressiveness even if the person is not claustrophobic because the patient must lie within a space surrounded by a tubular assembly of the dipolar ring magnet.

In view of the above mentioned economical and psychological problems, the MRI instruments with a dipolar ring magnet system are under continuous replacement with MRI instruments using an opposite permanent magnet system such as those disclosed in WO 84/00611 (PCT/US 83/01175), Japanese Utility Model Publications 2-44483, 2-44484, 2-44485 and 2-44486, *Eizo Joho* (Imaging information), volume 15, page 379 (1983), *Byotai Seiri* (Disease Condition Physiology), volume 4, page 91 (1985) and elsewhere.

FIG. 2 of the accompanying drawing illustrates a basic arrangement of a magnetic circuit system of the opposite magnets type used in an MRI instrument by a side view, in which a pair of permanent magnets 11, 11 are oppositely installed up and down as connected by the yokes 13, 13 forming an air gap 15 therebetween, in which the patient under inspection lies. Each of the permanent magnets 11, 11 is provided on the surface facing the air gap 15 with a shimmed pole piece 12 having a circular shim 12A which is a kind of yoke made from a soft magnetic material and which serves to improve the uniformity of the magnetic field in the air gap 15.

FIGS. 3A and 3B are for the illustration of an improvement in the magnetic field shimming effect for the lower half of the magnetic circuit system, the upper half being arranged symmetrically to the lower half, by a radial cross sectional view and a plan view, respectively, in which the lower permanent magnet (not shown in the figures) is provided, as mounted on the upper surface thereof, with a shimmed pole piece 12 and, further thereon, with a gradient coil 14 installed on the surface of the shimmed pole piece 12 as surrounded by the circular shim 12A to face the air gap 15 above. A pulse current of a rectangular waveform is applied to each of the upper and lower gradient coils 14, 14 to generate a gradient magnetic field in the air gap 15. The interaction between the gradient coil 14 and the shimmed pole piece 12 by the magnetic pulse field is a great factor on which the performance of the MRI instrument with the opposite magnets system depends.

The above mentioned interaction between the gradient coil 14 and the shimmed pole piece 12 involves problems in two aspects, of which the first is the eddy currents induced in the shimmed pole piece 12 by the magnetic pulse field and the second is the magnetization of the shimmed pole piece 12 by the magnetic pulse field. The eddy current induced in the shimmed pole piece 12 has an adverse effect to round the shoulders of the inherently rectangular waveform of the pulse-wise magnetic field resulting in a decrease in the S/N ratio due to the decrease in the effective time span available for generation of the NMR signals while the magnetization of the shimmed pole piece 12 has an effect of disturbing the uniformity of the magnetic field in the air gap 15. At any rate, these undesirable phenomena must be eliminated as completely as possible in order that the permanent-magnet MRI instrument can exhibit fully practical performance.

The eddy currents induced in the shimmed pole piece 12 can be decreased by a simple countermeasure of either using a material of high electric resistivity to form the shimmed pole piece 12 or constructing the shimmed pole piece 12 to have a structure which is equivalent to those made from a high resistivity material. The former approach can be accomplished by using a high-resistivity material such as magnetic ferrites and the like having a resistivity approximate to that of insulating materials. The latter approach can be accomplished by constructing the shimmed pole piece 12 in the form of a laminate consisting of a plurality of thin sheets of iron or silicon steel, each of the sheets being electrically insulated from the adjacent ones as a matter of course. For example, Japanese Patent Kokai 63-25907 teaches use of a soft magnetic ferrite or resin-bond iron as a material of the shimmed pole piece while Japanese Patent Kokai 61-263605, 63-241905, 1-304709 and 2-2603 disclose a laminated structure of the shimmed pole piece by using thin sheets of a magnetic steel or silicon steel. Further, Japanese Patent Kokai 4-82536 and 6-251930 disclose a shimmed pole piece by the use of sheets of silicon steel, ferrite and iron yokes in combination. The problem of eddy currents can be solved by undertaking these measures if not completely.

A greater difficulty would be encountered in undertaking a countermeasure to decrease magnetization or residual magnetization of the shimmed pole piece 12 than against the problem of eddy currents. Although the shimmed pole piece 12 must be formed from a soft magnetic material in order to exhibit a magnetic field shimming effect, magnetization of the shimmed pole piece 12 by the pulse-wise magnetic field is more or less unavoidable as an inherency of any magnetic materials of which the behavior of magnetization necessarily follows a hysteresis loop of magnetization.

Various attempts and proposals have been made heretofore to decrease the magnetization of the shimmed pole piece 12 by the pulse-wise magnetic field generated by the gradient coil 14. For example, Japanese Patent Kokai 4-23411 teaches use of a soft magnetic ferrite as the material of the shimmed pole piece 12 and Japanese Patent Kokai 61-203605, 4-138131 and 4-138132 teach use of magnetic steel sheets and silicon steel sheets. Further, Japanese Patent Kokai 5-182821 discloses a shimmed pole piece having a structure constructed by using silicon steel sheets or a ferrite in combination with iron yokes. These countermeasures are of course not without any improvement to decrease magnetization of the shimmed pole piece but the effectiveness thereof is only very limited and thus providing no fundamental solution of the problem.

Apart from the above described improvements by the modification of the material or structure of the shimmed pole piece with an object to decrease the residual magnetization thereof, an alternative approach is now under practice to solve the problems of the eddy currents and magnetization in and of the shimmed pole piece by undertaking a measure to prevent the gradient magnetic flux from intrusion into the shimmed pole piece. This approach can be accomplished, for example, by providing a cancellation coil or a plate of a highly electroconductive non-magnetic material such as aluminum and copper between the gradient coil 14 and the shimmed pole piece 12, which has an effect of preventing the gradient magnetic flux from intrusion into the shimmed pole piece 12.

This way, however, is not quite satisfactory due to the problem that, since the gradient magnetic field is decreased by the cancellation coil or by the eddy currents induced in the non-magnetic plate, the electric current through the gradient coil must be increased so much necessitating a larger power source for the gradient magnetic field or resulting in an increased heat evolution in the gradient coil.

In view of the above described situations and the desire to develop a measure for greatly decreasing the residual magnetization induced in the shimmed pole piece of a magnetic circuit system with opposite permanent magnets, the inventors have conducted extensive investigations leading to an unexpected discovery on the base of which the present invention has been completed.

SUMMARY OF THE INVENTION

The fact unexpectedly discovered as mentioned above leading to the present invention is that the residual magnetization induced in the shimmed pole piece by the gradient magnetic field can be cancelled by providing a thin plate of a magnetic material attached to the gradient coil on the surface facing the air gap of the magnetic circuit system so that the thin magnetic plate is magnetized in the direction reverse to that in the shimmed pole piece to exhibit a cancelling effect on the changes of the magnetic field in the air gap. Since this cancellation magnetic plate attached to the gradient coil is positioned closer to the air gap for a uniform magnetic field than the shimmed pole piece per se, a great advantage can be obtained by the attachment of even a very small cancellation magnetic plate as compared with the shimmed pole piece so that the thickness of the cancellation magnetic plate can be as small as 0.5 mm or even smaller so as not to cause a decrease in the efficiency of the gradient magnetic field generation as is the case when the cancellation magnetic plate has a large thickness.

Thus, the present invention provides an improvement, in a magnetic circuit system for an MRI instrument comprising a pair of permanent magnets oppositely positioned up and down forming an air gap therebetween as being connected by yokes, a pair of shimmed pole pieces each being attached to one of the permanent magnets to face the air gap and a pair of gradient coils each being attached to the surface of one of the shimmed pole pieces to face the air gap, which improvement comprises providing a cancellation magnetic plate, which has a thickness not exceeding 0.5 mm and a base area in the range from 5% to 75% relative to the base area of the gradient coil, attached to each of the gradient coils on or above the surface facing the air gap, the magnetic material of the cancellation magnetic plate having a coercive force in the range from 0.1 to 500 Oe.

DETAILED DESCRIPTION OF THE PREFERRED EMBODIMENTS

In order to accomplish an improvement according to the above described principle by providing a cancellation magnetic plate on each of the gradient coils, a desirable cancelling effect on the residual magnetization of the shimmed pole piece can be exhibited only by optimization of several factors including the magnetic properties of the material of the cancellation magnetic plate such as saturation magnetization and coercive force, dimensions and construction of the cancellation magnetic plate, relative position of the cancellation magnetic plate to the gradient coil and so on. These factors can never be optimized by routine works but must be established only by intended investigations in great detail.

In the following, the present invention is illustrated in more detail by making reference to the accompanying drawing.

Figure 1A:
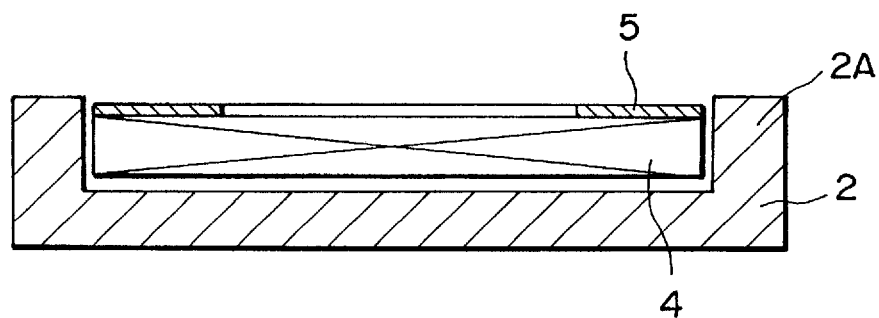
FIGS. 1A and 1B are a vertical cross sectional view and a plan view, respectively, of an assembly consisting of a shimmed pole piece, gradient coil and cancellation magnetic plate according to the invention.
Figure 1B:
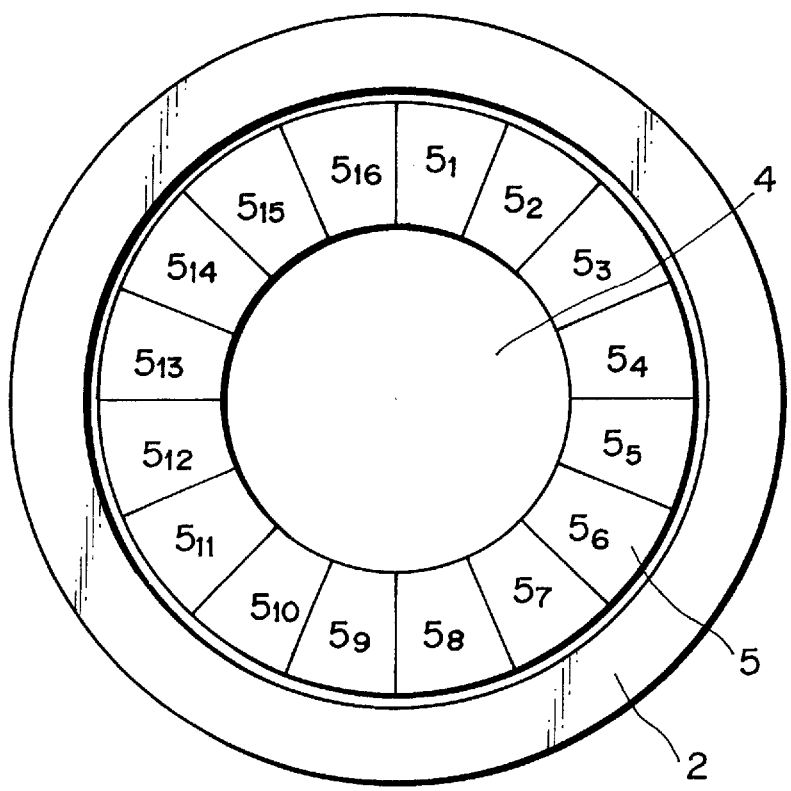
Figure 2:
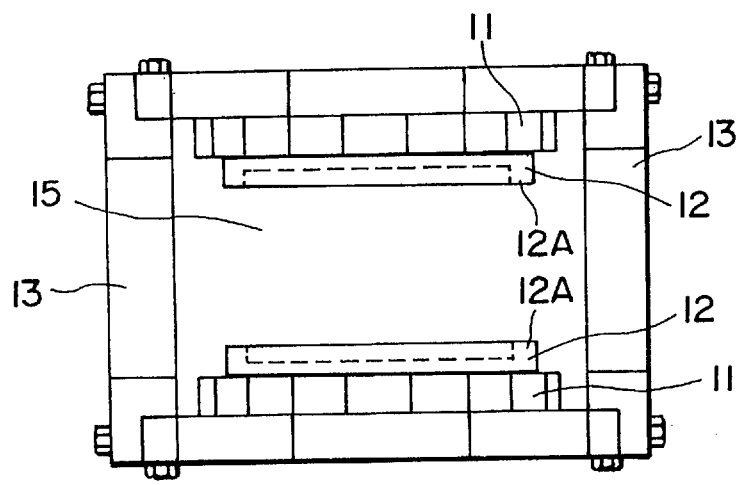
FIG. 2 is a schematic side elevational view of a conventional magnetic circuit system consisting of a pair of permanent magnets connected by yokes and a pair of shimmed pole pieces.
Figure 3A:
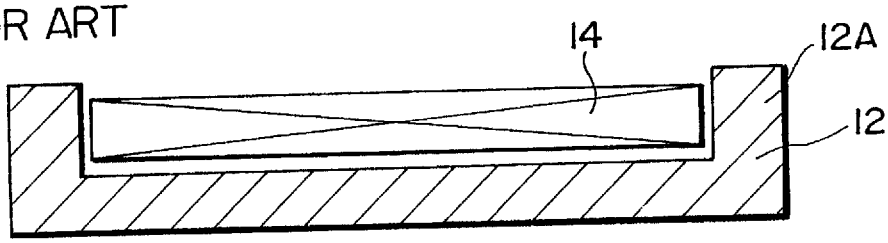
FIGS. 3A and 3B are a vertical cross sectional view and a plan view, respectively, of a conventional assembly consisting of a shimmed pole piece and a gradient coil.
Figure 3B:
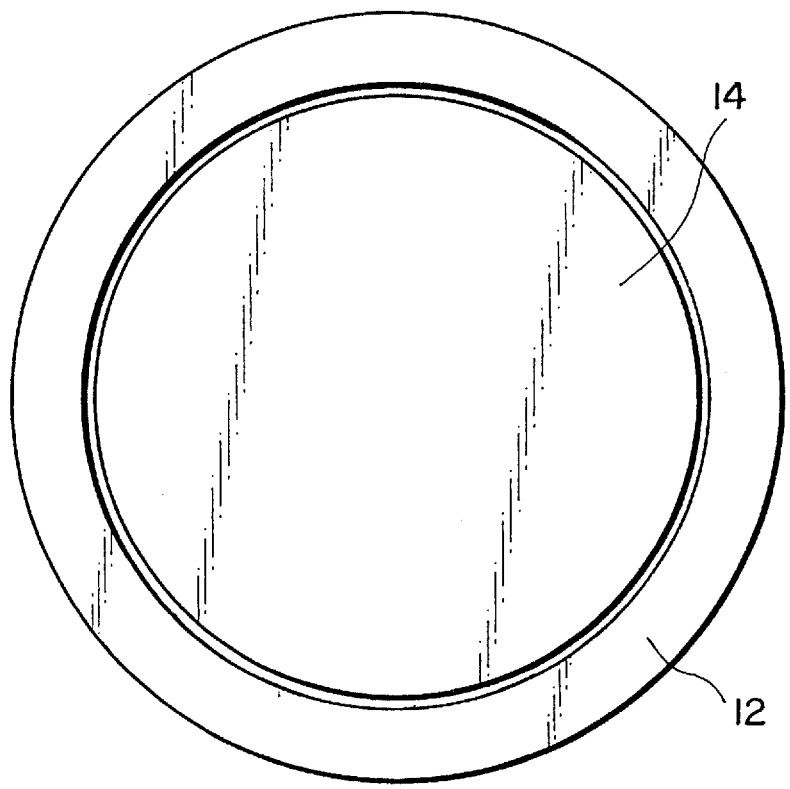

FIGS. 1A and 1B are a vertical or radial cross sectional view and a plan view, respectively, of an assembly consisting of a shimmed pole piece 2, gradient coil 4 and cancellation magnetic plate 5 for the lower half of the inventive magnetic circuit system with the permanent magnet omitted in the figure, the assembly for the upper half of the system being symmetrical to the lower half. The shimmed pole piece 2 and the gradient coil 4 can be conventional like those shown in FIGS. 3A and 3B illustrating a conventional assembly.

The cancellation magnetic plate 5 of the embodiment illustrated in FIGS. 1A and 1B is, preferably, in an annular form made up by arranging together a plurality of or, for example, sixteen segment pieces $5_1$ to $5_{16}$ in a manner of something like a patchwork on the surface of the gradient coil 4 facing the air gap formed by the opposite permanent magnets. Each of the segment pieces $5_1$ to $5_{16}$ is electrically insulated from the adjacent ones in consideration of the eddy currents otherwise induced therein. Namely, the cancellation magnetic plate 5 is preferably in the form of a complete or annular disk or polygon in respect of the high axial symmetry ensured therewith. Although the cancellation magnetic plate 5 can be formed, as is illustrated in FIG. 1B, by a ring-wise arrangement of a plurality of segment pieces $5_1$ to $5_{16}$, it should be taken into consideration in selecting the dimensions or configuration and attaching position of each segment piece that the effect of a particular segment piece is not limited to the space just above the piece per se but a particular segment piece has influences also on the portions of the space adjacent to the portion of the space just above the particular piece and that each of the segment pieces is under interaction with the other segment pieces.

When the cancellation magnetic plate is in an annular form as is the case in FIGS. 1A and 1B not to cover the central area of the gradient coil 4, an increased distance is always kept between the cancellation magnetic plate 5 and the portion of the air gap space just above the center of the gradient coil 4 for uniform magnetic field so that the influence of the cancellation magnetic plate 5 is relatively moderate and uniform on the air gap space for uniform magnetic field. When the center area of the gradient coil 4 is covered by a part of the cancellation magnetic plate 5, on the other hand, such a central part of the cancellation magnetic plate 5 has a relatively strong local influence on the magnetic field in the portion of the air gap space close to the central part of the cancellation magnetic plate 5. This differentiation in the relative influences of the cancellation magnetic plate 5 from part to part can be or should be taken into consideration depending on the distribution of the residual magnetization in the shimmed pole piece 2 in the design of the cancellation magnetic plate 5, for example, by selecting a combination of an annular form and a disk form for the cancellation magnetic plate 5.

The cancellation magnetic plate 5 should have a base area in the range from 5% to 75% or, preferably, from 5% to 65% based on the base area of the gradient coil 4. When the base area of the cancellation magnetic plate 5 is too small, the desired cancelling effect on the residual magnetization of the shimmed pole piece 2 cannot be exhibited as a matter of course while a too large base area of the cancellation magnetic plate 5 causes a disadvantage due to overcancellation of the residual magnetization.

The thickness of the cancellation magnetic plate 5 is preferably not exceeding 0.5 mm or, more preferably in the range from 0.05 to 0.3 mm. When the cancellation magnetic plate 5 is a lamination of several thin magnetic sheets, this thickness requirement can be satisfied by the overall thickness of the thin sheets laid one on the other. For example, the cancellation magnetic plate 5 can be a lamination of ten thin sheets each having a thickness of 0.05 mm to build up an overall thickness of 0.5 mm. Such a laminated structure of the cancellation magnetic plate 5 is sometimes advantageous as compared with a single solid plate when each of the thin sheets is electrically insulated from the adjacent ones because of the decrease in the generation of eddy currents therein under application of a gradient magnetic field. In this regard of decreasing the adverse influences by the eddy currents, the cancellation magnetic plate 5 constructed by the sector-wise arrangement of a number of segment pieces as is illustrated in FIG. 1B is also advantageous when each of the segment pieces $5_1$ to $5_{16}$ is electrically insulated from the adjacent ones.

Selection of the magnetic material is also important for obtaining a fully effective cancellation magnetic plate 5. For example, the magnetic material should have a saturation magnetization as high as possible because the weight of the cancellation magnetic plate 5 can be decreased when it is made from a magnetic material of high saturation magnetization which corresponds to a large residual magnetization. In this regard, it is preferable that the cancellation magnetic plate 5 is made from iron or an ironcontaining alloy.

The coercive force of the magnetic material also has an influence on the residual magnetization of the cancellation magnetic plate 5 induced by the gradient magnetic field. While the residual magnetization of a magnetic material can be greater when the coercive force of the material is larger and the squareness ratio of the magnetic hysteresis loop is larger, the coercive force of the magnetic material for the cancellation magnetic plate 5 should not exceed 500 Oe because, when the coercive force of the magnetic material is too large, the cancellation magnetic plate 5 can hardly be magnetized with a small gradient magnetic field so that the desired cancelling effect on the residual magnetization of the shimmed pole piece 2 cannot be fully exhibited, in particular, in the low magnetic field side. When the coercive force of the magnetic material is too small, on the other hand, the residual magnetization of the cancellation magnetic plate 5 cannot be large enough even with a large squareness ratio of the hysteresis loop. This is because the cancellation magnetic plate 5, when magnetized, is under an influence of the demagnetizing field to cause tilting of the hysteresis loop of the material by the demagnetizing field and the cancelling effect on the residual magnetization of the shimmed pole piece 2 cannot be high enough. In this regard, the magnetic material of the cancellation magnetic plate 5 should have a coercive force not lower than 0.1 Oe. Namely, the coercive force of the magnetic material should be in the range from 0.1 to 500 Oe or, preferably, from 0.1 to 100 Oe.

In the following, the improvement according to the present invention is illustrated in further detail by way of Examples and a Comparative Example.

EXAMPLE 1

A magnetic circuit system for an MRI instrument was constructed by oppositely connecting two permanent magnets up and down with yokes to form a 400 mm high air gap therebetween, in which the magnetic field was about 2 kG. As is shown in FIGS. 1A and 1B, which are given for the lower half of the magnetic circuit system, the arrangement for the upper half of the system being symmetrical to the lower half, a shimmed pole piece 2 having an outer diameter of 1000 mm and a circular shim 2A of 100 mm width and 50 mm height was mounted on the upper surface of the lower permanent magnet (not shown in the figures) and a gradient coil 4 was mounted above the shimmed pole piece 2 with a narrow gap therebetween as surrounded by the circular shim 2A.

A cancellation magnetic plate 5 made from a 0.3 mm thick iron sheet having a coercive force of 5 Oe was attached to the upper surface of the gradient coil 4. The cancellation magnetic plate 5 had an annular form having an outer diameter of 800 mm and an inner diameter of 500 mm but was divided into sixteen equal segments $5_1$ to $5_{16}$ with electric insulation between adjacent segments in an object to reduce the eddy currents within the plane of the plate 5. Accordingly, the base area of the annular cancellation magnetic plate 5 was just 61% of the base area of the gradient coil 4. The magnetization of the cancellation magnetic plate 5 was 18 kG under application of an external magnetic field of 50 gauss.

The uniformity of the magnetic field in the air gap space between the upper and lower cancellation magnetic plates 5,5 was examined in the following manner. Thus, the upper and lower gradient coils 4,4 were respectively energized to generate a gradient magnetic field of ±1 gauss/cm in the vertical direction, i.e. along the z-axis connecting the centers of the upper and lower permanent magnets, and the magnetic field was determined at the center point on the z-axis and at the off-center point 75 mm or 150 mm above or below the center point to record the ratio of the difference in the magnetic field between the center point and the off-center point 75 mm or 150 mm apart therefrom to the magnetic field at the center point as a measure of the non-uniformity in the magnetic field which was 2 ppm for the 75-mm off-center point and 9 ppm for the 150-mm off-center point.

Comparative Example

The experimental procedure was just the same as in Example 1 described above except for the replacement of the cancellation magnetic plates 5,5 made from iron of 5 Oe coercive force with those of the same dimensions made from a Permalloy having a coercive force of 0.05 Oe to find that the non-uniformity of the magnetic field in the air gap space was 10 ppm and 32 ppm for the offcenter points of 75 mm and 150 mm apart from the center point on the z-axis, respectively.

EXAMPLE 2

The experimental procedure was just the same as in Example 1 described above except for the replacement of the cancellation magnetic plates 5,5 made from iron of 5 Oe coercive force with those having an outer diameter of 800 mm, inner diameter of 420 mm and thickness of 0.1 mm and made from iron having a coercive force of 1 Oe to find that the non-uniformity of the magnetic field in the air gap space was 7 ppm and 16 ppm for the off-center points of 75 mm and 150 mm apart from the center point on the z-axis, respectively.

EXAMPLE 3

The experimental procedure was just the same as in Example 1 described above except for the replacement of the cancellation magnetic plates 5,5 made from iron of 5 Oe coercive force with those having an outer diameter of 790 mm, inner diameter of 700 mm and thickness of 0.5 mm and made from iron having a coercive force of 70 Oe to find that the non-uniformity of the magnetic field in the air gap space was 8 ppm and 18 ppm for the off-center points of 75 mm and 150 mm apart from the center point on the z-axis, respectively.

What is claimed is:

1. A magnetic circuit system for an MRI instrument, said magnetic circuit system comprising:

two permanent magnets each having a face surface, wherein said two permanent magnets are positioned at a predetermined distance from each other such that the face surfaces of said two permanent magnets oppose each other;

two shimmed pole pieces each attached to the face surface of one of said two permanent magnets;

two gradient coils each attached to one of said two shimmed pole pieces; and two cancellation magnetic plates each attached to one of said two gradient coils so as to form a gap between said two cancellation magnetic plates, wherein each of said two cancellation magnetic plates has a thickness no greater than 0.5 mm, a base area which is in a range of 5% to 75% of a base area of each of said two gradient coils, and a coercive force in a range of 0.1 to 500 Oe, and wherein each of said two cancellation magnetic plates has an annular form and is divided into a plurality of segments pieces which are electrically insulated from one another.

2. A system as claimed in claim 1, wherein the base area of each of said two cancellation magnetic plates is in a range of 5% to 65% of the base area of each of said two gradient coils.

3. A system as claimed in claim 1, wherein the thickness of each of said two cancellation magnetic plates is in a range of 0.05 to 0.3 mm.

4. A system as claimed in claim 1, wherein the coercive force of each of said two cancellation magnetic plates is in a range of 0.1 to 100 Oe.

5. A system as claimed in claim 1, wherein each of said two cancellation magnetic plates comprises iron or an iron-containing alloy.

* * * * *